US010147604B2

(12) United States Patent
Mitzi et al.

(10) Patent No.: US 10,147,604 B2
(45) Date of Patent: Dec. 4, 2018

(54) AQUEOUS-BASED METHOD OF FORMING SEMICONDUCTOR FILM AND PHOTOVOLTAIC DEVICE INCLUDING THE FILM

(75) Inventors: David B. Mitzi, Mahopac, NY (US); Teodor K. Todorov, Yorktown Heights, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 842 days.

(21) Appl. No.: 12/718,039

(22) Filed: Mar. 5, 2010

(65) Prior Publication Data
US 2011/0097496 A1   Apr. 28, 2011

Related U.S. Application Data

(63) Continuation-in-part of application No. 12/606,210, filed on Oct. 27, 2009, now abandoned.

(51) Int. Cl.
*B05D 3/02* (2006.01)
*H01L 21/02* (2006.01)
(Continued)

(52) U.S. Cl.
CPC .... *H01L 21/02601* (2013.01); *H01L 21/0237* (2013.01); *H01L 21/02568* (2013.01);
(Continued)

(58) Field of Classification Search
CPC ................................................ H01L 21/02601
(Continued)

(56) References Cited

U.S. PATENT DOCUMENTS 4,242,374 A   12/1980   Sansregret
5,436,204 A    7/1995   Albin et al.
(Continued)

FOREIGN PATENT DOCUMENTS

CN   101000865 A   7/2007
JP    62030693 A   2/1987
(Continued)

OTHER PUBLICATIONS

Steinhagen et al., Synthesis of Cu2ZnSnS4 Nanocrystals for Use in Low-Cost Photovoltaics, JACS, Jul. 16, 2009, p. 12554-12555.*
(Continued)

*Primary Examiner* — Tabatha L Penny
(74) *Attorney, Agent, or Firm* — Cantor Colburn LLP; Vazken Alexanian

(57) ABSTRACT

A method with enhanced safety characteristics of depositing a kesterite film, which includes a compound of the formula: $Cu_{2-x}Zn_{1+y}Sn(S_{1-z}Se_z)_{4+q}$, wherein $0 \leq x \leq 1$; $0 \leq y \leq 1$; $0 \leq z \leq 1$; $-1 \leq q \leq 1$. The method includes contacting an aqueous solvent, ammonia, a source of hydrazine, a source of Cu, a source of Sn, a source of Zn, a source of at least one of S and Se, under conditions sufficient to form an aqueous dispersion which includes solid particles; applying the dispersion onto a substrate to form a thin layer of the dispersion on the substrate; and annealing at a temperature, pressure, and length of time sufficient to form the kesterite film. An annealing composition and a photovoltaic device including the kesterite film formed by the above method are also provided.

10 Claims, 3 Drawing Sheets

(51) Int. Cl.
*H01L 31/032* (2006.01)
*H01L 31/0749* (2012.01)

(52) U.S. Cl.
CPC .... *H01L 21/02628* (2013.01); *H01L 31/0322* (2013.01); *H01L 31/0749* (2013.01); *Y02E 10/541* (2013.01); *Y02P 70/521* (2015.11)

(58) Field of Classification Search
USPC ..................................................... 427/383.1
See application file for complete search history.

(56) References Cited

U.S. PATENT DOCUMENTS

| | | | |
|---|---|---|---|
| 5,858,121 A | | 1/1999 | Wada et al. |
| 5,958,358 A | | 9/1999 | Tenne et al. |
| 6,107,562 A | * | 8/2000 | Hashimoto et al. .......... 136/252 |
| 7,094,651 B2 | | 8/2006 | Mitzi et al. |
| 7,390,715 B2 | | 6/2008 | Ou et al. |
| 7,393,699 B2 | | 7/2008 | Tran |
| 7,534,490 B1 | | 5/2009 | Goh et al. |
| 2004/0202789 A1 | | 10/2004 | Patil et al. |
| 2005/0009225 A1 | * | 1/2005 | Mitzi et al. .................... 438/59 |
| 2005/0043184 A1 | | 2/2005 | McCleskey et al. |
| 2005/0205958 A1 | | 9/2005 | Taniguchi et al. |
| 2007/0160747 A1 | * | 7/2007 | Mitzi et al. .................... 427/74 |
| 2008/0178927 A1 | | 7/2008 | Brezoczky et al. |
| 2008/0238294 A1 | | 10/2008 | Xu et al. |
| 2009/0098481 A1 | | 4/2009 | Nakahira |
| 2009/0107550 A1 | | 4/2009 | Van Duren et al. |
| 2009/0114908 A1 | | 5/2009 | Hirai et al. |
| 2009/0205714 A1 | | 8/2009 | Kuhnlein et al. |
| 2009/0205717 A1 | | 8/2009 | Yuan |
| 2011/0094557 A1 | | 4/2011 | Mitzi et al. |
| 2012/0279565 A1 | | 11/2012 | Mitzi et al. |

FOREIGN PATENT DOCUMENTS

| | | |
|---|---|---|
| JP | 2007185764 A | 7/2007 |
| JP | 2009105130 A | 5/2009 |
| JP | 2009537997 A | 10/2009 |
| JP | 2012527402 A | 11/2012 |
| WO | 2007134843 A2 | 11/2007 |
| WO | 2007134848 A2 | 11/2007 |
| WO | 2008057119 A1 | 5/2008 |

OTHER PUBLICATIONS

Guo, Synthesis of Cu2ZnSnS4 Nanocrystal Ink and Its Use for Solar Cells, JACS Communications, 131, Published on Web Jul. 31, 2009, p. 11672-11673.*
Q. Guo, "Synthesis of Cu2ZnSnS4 Nanocrystal Ink and its Use for Solar Cells," J. Am. Chem. Soc. 131, pp. 11672-11673, 2009.
H. Katagiri, et al, "Development of CZTS-based Thin Film Solar Cells," Thin Solid Films 517, pp. 2455-2460, 2009.
T. Todorov, et al., "Cu2ZNSnS4 Films Deposited by a Soft-Chemistry Method," Thin Solid Films 517, pp. 2541-2544, 2009.
Tanaka, et al., "CU2ZnSnS4 Thin Film Solar Cells Prepared by Non-Vacuum Processing," Solar Energy Materials and Solar Cells 93, pp. 583-587, 2009.
Mitzi, "Torwards marketable efficiency solution-processed . . . devices", 35th IEEE Photovoltaic Specialists Conference, Jun. 20-25, 2010, pp. 640-645.
Steihhaten, Synthesis of Cu27nSnS4 nanocrystais for . . . photovoltalcs, Journal of the American Chemical Society, vol. 131, No. 35, Sep. 9, 2009. pp. 12554-12555.
Min, "Influences of Synthesizing . . . deposition", Journal of Sol-Gel Science & Technology, vol, 52, No. 1, May 29, 2009, pp. 65-68.
Mitzi, "Hydrazine-based deposition . . . films", Thin Solid Films, Elsevier-Sequoia, SA, vol. 517, No, 7, Feb. 9, 2009, pp. 2158-2162.
Kishore, Preparation and Characterization of spray-deposited . . . films, Solar Energy Materials and Solar Cells, vol. 93, No. 8, Aug. 1, 2009, pp. 1230-1237.
Amendment to Office Action filed in U.S. Appl. No. 12/606,210, dated Jul. 27, 2012; 12 pages.
Amendment to Office Action Filed in U.S. Appl. No. 12/606,210, dated Nov. 26, 2012; 11 pages.
Advisory Action issued in U.S. Appl. No. 12/606,210, dated Dec. 12, 2012; 3 pages.
Amendment to Office Action filed in U.S. Appl. No. 12/606,210, dated Dec. 31, 2012; 12 pages.
Final Office Action issued in U.S. Appl. No. 12/606,210, dated Oct. 5, 2012; 16 pages.
Interview Summary issued in U.S. Appl. No. 12/606,210 dated Jan. 10, 2013; 3 pages.
Non Final Office Action issued in U.S. Appl. No. 12/606,210, dated May 10, 2012; 22 pages.
Non Final Office Action issued in U.S. Appl. No. 13/552,080 dated Mar. 14, 2013; 14 pages.
Request for Continued Examination Filed in U.S. Appl. No. 12/606,210, filed Jan. 2, 2013; 3 pages.
Response to Restriction Requirement filed in U.S. Appl. No. 12/606,210 dated Apr. 23, 2012; 9 pages.
Restriction Requirement issued in U.S. Appl. No. 12/606,210 dated Mar. 29, 2012; 13 pages.
Terminal Disclaimer Filed in U.S. Appl. No. 12/606,210, dated Nov. 27, 2012; 2 pages.
Amendment to Office Action Filed in U.S. Appl. No. 13/552,080 dated Jun. 14, 2013; 9 pages.
Definition of "disperse " by Merriam-Webster retrieved from http://www.merriam-webster.com/dictionary/disperse on Jul. 22, 2013;3 pages.
Final Office Action issued in U.S. Appl. No. 13/552,080 dated Jul. 30, 2013; 16 pages.
Examination Report issued in Great Britain Application No. GB1201821.4 dated Jul. 10, 2013; 3 pages.
Kishore, "Preparation and Characterization of Spray-Deposited . . . Films," Solar Energy Materials and Solar Cells, vol. 93, No. 8, pp. 1230-1237, Aug. 2009.
Examination Report issued in Great Britain Application No. GB1201821. 4, dated Nov. 15, 2013; 3 pages.
Final Office Action issued in U.S. Appl. No. 12/606,210 dated Jan. 27, 2014; 21 pages.
Steinhagen, "Synthesis of Cu2ZnSnS4 Nanocrystals for Use in Low-Cost Photovoltaics," Journal of the American Chemical Society, vol. 131; 12554-12555, Jul. 2009.
Amendment to Final Office Action filed in U.S. Appl. No. 13/552,080 dated Jul. 30, 2013; 7 pages.
Non-Final Office Action issued in U.S. Appl. No. 12/606,210 dated Sep. 30, 2013; 23 pages.
Steinhagen, "Synthesis of Cu27nSnS4 Nanocrystals for Use in Low-Cost Photovoltaics," Journal of the American Chemical Society, vol. 131, No. 35, pp. 12554-12555, Sep. 2009.
Colombara, et al., "Electrodeposition of kesterite thin films for photovaltaic applications: Quo vadis?" Phys. Status Solidi A; vol. 212, No. 1, 88-102 (2015); DOI 10.1002/pssa.201431364.

* cited by examiner

AQUEOUS-BASED METHOD OF FORMING SEMICONDUCTOR FILM AND PHOTOVOLTAIC DEVICE INCLUDING THE FILM

CROSS-REFERENCE TO RELATED APPLICATION

This application is related to and is a Continuation-in-Part of the commonly owned U.S. application Ser. No. 12/606,210, filed on Oct. 27, 2009, the contents of which are being fully incorporated herein by reference.

BACKGROUND OF THE INVENTION

1. Field of the Invention

The present invention relates to a method of depositing a kesterite film. More particularly, the present invention relates to a method of depositing a kesterite film from an aqueous dispersion.

2. Description of Related Art

Large-scale production of photovoltaic devices requires high-throughput technologies and abundant environmentally friendly materials. Thin-film chalcogenide-based solar cells provide a promising pathway to cost parity between photovoltaic and conventional energy sources.

Currently, only $Cu(In,Ga)(S,Se)_2$ and CdTe technologies have reached commercial production and offer over 10 percent power conversion efficiency. These technologies generally employ (i) indium and tellurium, which are relatively rare elements in the earth's crust, or (ii) cadmium, which is a highly toxic heavy metal.

Copper-zinc-tin-chalcogenide kesterites have been investigated as potential alternatives because they are based on readily available and lower cost elements. However, photovoltaic cells with kesterites, even when produced using high cost vacuum-based methods, have so far achieved at best only <6.7 percent efficiencies, see Katagiri, H. et al. Development of CZTS-based thin film solar cells; Thin Solid Films 517, 2455-2460 (2009).

K. Tanaka, M. Oonuki, N. Moritake, H. Uchiki, Solar Energy Mater. Sol. Cells 2009, 93, 583-587 describe a solution-based approach for an indium-free material which produced a photovoltaic device with efficiency of only 1%.

T. Todorov, M. Kita, J. Garda, P. Escribano, Thin Solid Films 2009, 517, 2541-2544 describe a deposition approach based on quaternary Cu—Zn—Sn—S precursors formed by reacting metal acetates and chlorides with elemental sulfur in ethylene glycol at 170° C.

Guo et al, J. Amer. Chem. Soc., 2009, 131, 11672-11673 have reported films deposited by a similar approach, subsequently subjected to selenization treatment. They have also reported that devices based on the $Cu_2ZnSnS_ySe_{1-y}$ films yield efficiencies of 0.74%, a level that is lower than the above solution approach for $Cu_2ZnSnS_4$.

The commonly owned and previously incorporated U.S. application Ser. No. 12/606,210 and a publication by T. Todorov, K. Reuter, D. B. Mitzi, Advanced Materials, (2010) Vol. 22, pages 1-4, describe a hydrazine-based deposition approach of depositing homogeneous chalcogenide layers from mixed slurries containing both dissolved and solid metal chalcogenide species dispersions of metal chalcogenides in systems that do not require organic binders. Upon anneal the particle-based precursors readily react with the solution component and form large-grained films with good electrical characteristics.

However, the use and transportation of pure hydrazine is regulated by the federal government because improper handling is associated with risk of ignition and pure hydrazine is used to propel rockets and missiles. Particularly hazardous are pure hydrazine vapors that, in the absence of a diluent gas (such as ammonia, water vapor or nitrogen), may explode if ignited, in contrast to other inflammable solvents that require oxygen to form explosive mixtures. Transportation and use of pure hydrazine in manufacturing therefore requires rigorous and expensive handling protocols in order to assure safe large-scale photovoltaic manufacturing based on prior-art methods.

Another processing challenge associated with previous methods is the exceptional activity of pure hydrazine as a solvent, making it incompatible with numerous materials typically used in processing equipment, such as a variety of plastics and metals. In addition, control of the ratio between the dissolved and solid component in pure hydrazine is difficult to achieve in order to optimize rheological and coating characteristics of the obtained inks.

SUMMARY OF THE INVENTION

Accordingly, the present invention provides a method of depositing a kesterite film including a compound of the formula:

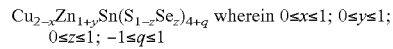

the method including the steps of: contacting a source of hydrazine, a source of Cu, a source of Sn, a source of at least one of S and Se, and a source of Zn in an aqueous solvent forming an aqueous dispersion containing solid particles and dissolved components; applying the aqueous dispersion onto a substrate to form a thin layer; and annealing at a temperature, pressure, and length of time sufficient to form the kesterite film.

The present invention further provides a method of depositing a kesterite film including a compound of the above formula including the steps of: contacting hydrazine, a source of Cu, and a source of at least one of S and Se forming solution A; contacting hydrazine, a source of Sn, a source of at least one of S and Se, and a source of Zn forming dispersion B; mixing the solution A and the dispersion B under conditions sufficient to form a dispersion including Zn-containing solid particles adding an aqueous solvent thereby forming an aqueous dispersion containing solid particles and dissolved components; applying the dispersion onto a substrate to form a thin layer; and annealing at a temperature, pressure, and length of time sufficient to form the kesterite film.

The present invention further provides a composition, including: an aqueous dispersion of Zn-containing solid particles formed from hydrazine, a source of Cu, a source of Sn, a source of Zn, and a source of at least one of S and Se, which when annealed, forms a compound of the formula:

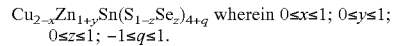

The present invention still further provides a photovoltaic device, including the above kesterite film formed by the above methods as the light absorbing layer.

The disadvantages associated with the prior art are overcome by the preferred embodiments of the present invention in which hydrazine is replaced with aqueous or aqueous-ammonia solutions thereof to overcome the ignition and explosion hazards associated with the methods of the prior art.

DETAILED DESCRIPTION OF THE PREFERRED EMBODIMENTS

Figure 1:
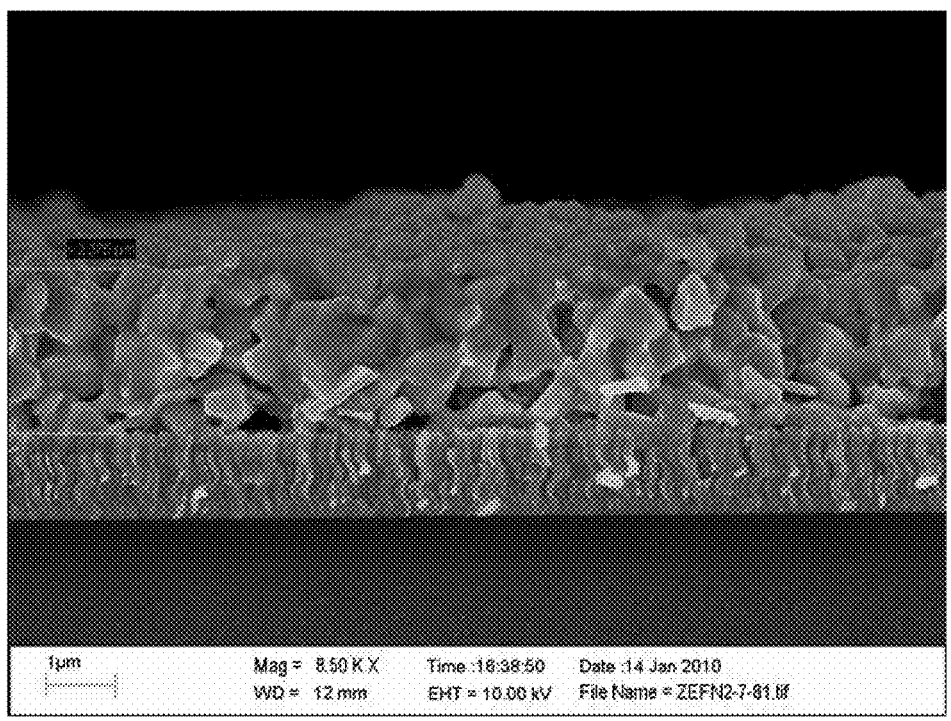
FIG. 1 is a cross-sectional scanning electron microscopy image of a solar cell prepared according to Example 1.

The present invention relates to a method of depositing a kesterite film having Cu, Zn, Sn, and at least one of S and Se, and more particularly to a method of deposition of kesterite-type Cu—Zn—Sn—(Se,S) materials and improved photovoltaic devices based on these films.

The method includes the steps of contacting a source of hydrazine, a source of Cu, a source of Sn, a source of at least one of S and Se, and a source of Zn in an aqueous solvent forming an aqueous dispersion containing solid particles and dissolved components; applying the aqueous dispersion onto a substrate to form a thin layer; and annealing at a temperature, pressure, and length of time sufficient to form the kesterite film.

The aqueous solvent includes water in an amount from about 1 weight % to about 99 weight %. It can further include ammonium hydroxide in an amount from about from 0.1 weight % to about 35 weight %. It can still further include at least one additive each containing a metal selected from: Li, Na, K, Mg, Ca, Sr, Ba, Sb, Bi, and a combination thereof, wherein the metal is present in an amount from about 0.01 weight % to about 5 weight %.

The aqueous solvent can further include a water soluble organic solvent.

The kesterite is represented by the formula:

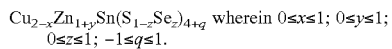

$Cu_{2-x}Zn_{1+y}Sn(S_{1-z}Se_z)_{4+q}$ wherein $0 \leq x \leq 1$; $0 \leq y \leq 1$; $0 \leq z \leq 1$; $-1 \leq q \leq 1$.

Preferably, the kesterite has the above formula wherein x, y, z and q respectively are: $0 \leq x \leq 0.5$; $0 \leq y \leq 0.5$; $0 \leq z \leq 1$; $-0.5 \leq q \leq 0.5$.

Preferably, the source of Cu is at least one of $Cu_2S$ and $Cu_2Se$; the source of Sn is at least one of SnSe, SnS, $SnSe_2$, and $SnS_2$; the source of Zn is at least one of metallic zinc, ZnS, and ZnSe; the source of S is selected from: elemental sulfur, CuS, $Cu_2S$, SnS, $SnS_2$, ZnS, and a mixture thereof; and the source of Se is selected from: elemental selenium, $SnSe_2$, and SnSe.

Preferably, the solid component includes particles having a particle size from about 2 nm to about 2000 nm and ranges therebetween and the dissolved component contains at least one of S, Se, Cu and Sn.

The substrate is selected from: metal foil, glass, ceramics, aluminum foil coated with a layer of molybdenum, a polymer, and a combination thereof. In a preferred embodiment, the substrate is coated with a transparent conductive coating.

The step of applying in the method of the present invention is preferably carried out by a method selected from: spin coating, dip coating, doctor blading, curtain coating, slide coating, spraying, slit casting, meniscus coating, screen printing, ink jet printing, pad printing, flexographic printing, and gravure printing.

The step of annealing is preferably carried out at a temperature from about 200° C. to about 800° C. and ranges therebetween. The step of annealing is typically carried out in an atmosphere including: at least one of: $N_2$, Ar, He, forming gas, and a mixture thereof. This atmosphere can further include vapors of at least one of: sulfur, selenium, and a compound thereof.

In a preferred embodiment, the method of depositing a kesterite film includes the steps of: contacting hydrazine, a source of Cu, and a source of at least one of S and Se forming solution A; contacting hydrazine, a source of Sn, a source of at least one of S and Se, and a source of Zn forming dispersion B; mixing the solution A and the dispersion B under conditions sufficient to form a dispersion including Zn-containing solid particles; adding an aqueous solvent thereby forming an aqueous dispersion containing solid particles and dissolved components; applying the dispersion onto a substrate to form a thin layer; and annealing at a temperature, pressure, and length of time sufficient to form the kesterite film.

Thus, the method of the present invention produces a composition which includes an aqueous dispersion of Zn-containing solid particles formed from hydrazine, a source of Cu, a source of Sn, a source of Zn, and a source of at least one of S and Se, which when annealed, forms a compound of the formula: $Cu_{2-x}Zn_{1+y}Sn(S_{1-z}Se_z)_{4+q}$ wherein $0 \leq x \leq 1$; $0 \leq y \leq 1$; $0 \leq z \leq 1$; $-1 \leq q \leq 1$ and preferably a compound of the above formula wherein x, y, z and q respectively are: $0 \leq x \leq 0.5$; $0 \leq y \leq 0.5 \leq z \leq 1$; $-0.5 \leq q \leq 0.5$.

The present invention further provides a photovoltaic device, including: a substrate having an electrically conductive surface; a kesterite film on the substrate formed by the method of the present invention; an n-type semiconducting layer; and a top electrode having a transparent conductive material. The substrate can be glass, plastic, polymer, ceramic, or aluminum foil, and can be coated with a molybdenum layer; the n-type semiconducting layer has at least one of: ZnS, CdS, InS, oxides thereof, and selenides thereof; and the transparent conductive material can be doped ZnO, Indium-tin oxide, doped tin oxide, or carbon nanotubes.

The present invention further provides a photovoltaic module which includes a plurality of electrically interconnected photovoltaic devices described in the present invention.

The aqueous and aqueous-ammonia systems are used as a vehicle for hybrid precursor inks including both dissolved and solid components of the targeted material, where the dissolved component acts as a binder, without introducing carbonaceous compounds into the solution that would generally end up as impurities in the final film. This aspect of the invention is related to the object of the disclosure of the commonly owned and previously incorporated U.S. application Ser. No. 12/606,210.

Nevertheless, a key advantage of the present invention over prior art is that the present invention provides better control of the composition and ratio of solid and liquid components. For example, this can be achieved by varying the composition of the aqueous dispersion of Zn-containing solid particles formed from hydrazine, a source of Cu, a source of Sn, a source of Zn, and a source of at least one of S and Se. By doing so, one can achieve optimal rheological and film-forming characteristics required of the dispersion to obtain the necessary thickness of the films formed thereby without crack-formation or de-lamination.

The present method provides a method with improved safety and handling characteristics for depositing a kesterite film.

The method includes the steps of contacting water, at least one of hydrazine and hydrazine-hydrate, a source of Cu, a source of Sn, a source of Zn and a source of at least one of S and Se, optionally ammonia or ammonium hydroxide under conditions sufficient to form an aqueous dispersion containing solid particles and dissolved components.

In one embodiment, pure hydrazine can be used during initial preparation in order to dissolve the raw materials and subsequently can be reacted with water to form hydrazine-hydrate solutions, optionally with ammonia addition to achieve improved safety characteristics.

Preferably, no pure hydrazine is used during the entire process, with instead hydrazine hydrate being used as the initial source of the reducing agent hydrazine. In this latter case hydrazine-hydrate may be contacted with a source of Cu, and a source of at least one of S and Se, forming solution A. Hydrazine hydrate and a source of Sn, a source of at least one of S and Se, and a source of Zn are also contacted forming dispersion B; Solution A and dispersion B are mixed under conditions sufficient to form a dispersion including Zn-containing solid particles.

The combined dispersion is mixed with water, for example, from 1 to 65% and/or ammonia in the form of ammonium hydroxide to a nominal ammonia content of from 1 to 25%. The dispersion is applied onto a substrate to form a thin layer of the dispersion on the substrate and the dispersion film is annealed at a temperature, pressure, and length of time sufficient to form the kesterite film.

The disadvantages associated with the prior art are overcome by the preferred embodiments of the present invention in which hydrazine is replaced with aqueous or aqueous-ammonia solutions thereof to overcome the ignition and explosion hazards associated with the methods of the prior art. Accordingly, it was found that addition of water to the reaction mixture greatly reduced the ignition and explosion hazards of such systems.

In vapor form, the risk of detonation is further very effectively suppressed by even low concentrations of ammonia gas, which can be introduced in addition to the already suppressing action of the water vapor (J. Troyan, Industrial Engineering Chemistry, Vol. 45, No. 12, 1953). Therefore, the use of water-based hydrazine-hydrate dispersions, especially in combination with ammonia, which has a vapor pressure three orders of magnitude higher than hydrazine-hydrate at room temperature, assures improved fire safety characteristics for large-scale photovoltaic manufacturing in comparison with prior art.

Example 1

Preparation of Aqueous Ammonia Dispersions by Diluting Pure Hydrazine Dispersions All operations were performed in a nitrogen-filled glove box. The deposition solution was prepared in two parts in glass vials under magnetic stirring: A1, by dissolving $Cu_2S$, 0.573 g and sulfur, 0.232 g in 3 ml of hydrazine and B1, by mixing SnSe, 0.790 g, Se, 1.736 g and Zn, 0.32 g with 7 ml of hydrazine. After 3 days under magnetic stirring, solution A1 had an orange transparent aspect, while B1 was dark green and opaque. Solutions A1 and dispersion B1 were mixed (C1) under magnetic stirring for 4 hours. 2 ml of dispersion C1 were mixed with 2 ml of 25% aqueous ammonia (ammonium hydroxide) to form dispersion D1.

Films of dispersion D1 were deposited on soda lime glass substrates coated with 700-1000 nm of molybdenum by spin coating at 800 rpm and heated preferably in a tubular oven or on a covered hot plate at about 425° C. for about 1 minute. The coating and heating cycle was repeated 5 or 6 times before a final anneal at 540° C. was carried out for about 10 minutes in the presence of sulfur vapor.

Referring to FIG. 1, a cross-sectional scanning electron microscopy image of a solar cell is shown. The film was prepared by a method according to Example 1.

Figure 2:
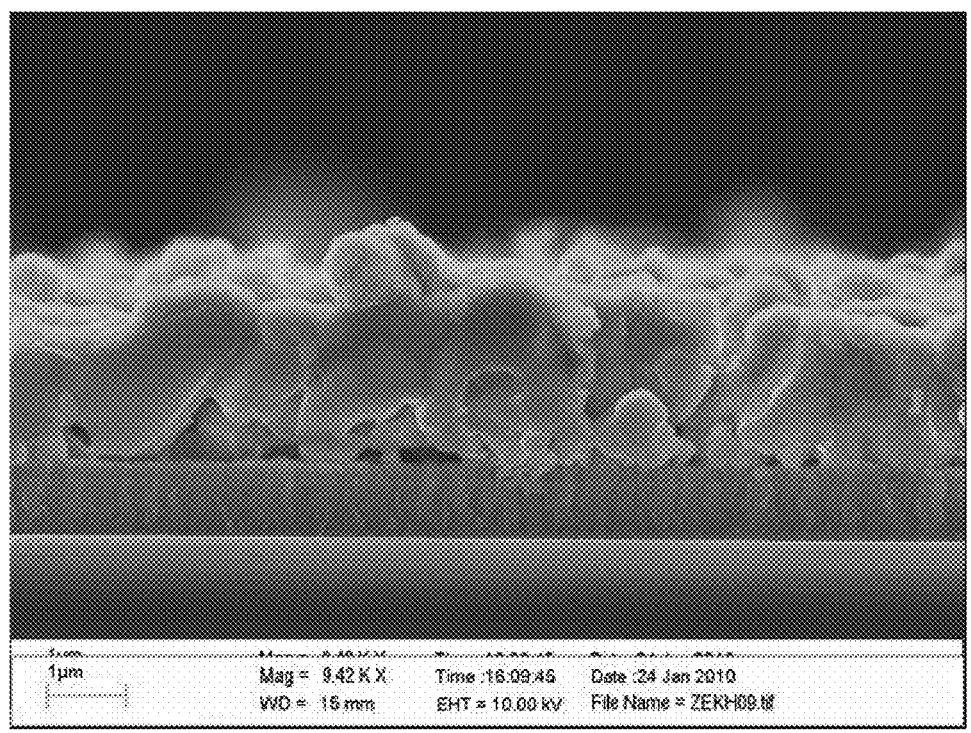
FIG. 2 is a cross-sectional scanning electron microscopy image of a solar cell prepared according to Example 2.

Referring to FIG. 2, a cross-sectional scanning electron microscopy image of a solar cell is shown. The film was prepared by a method according to Example 2.

Figure 3:
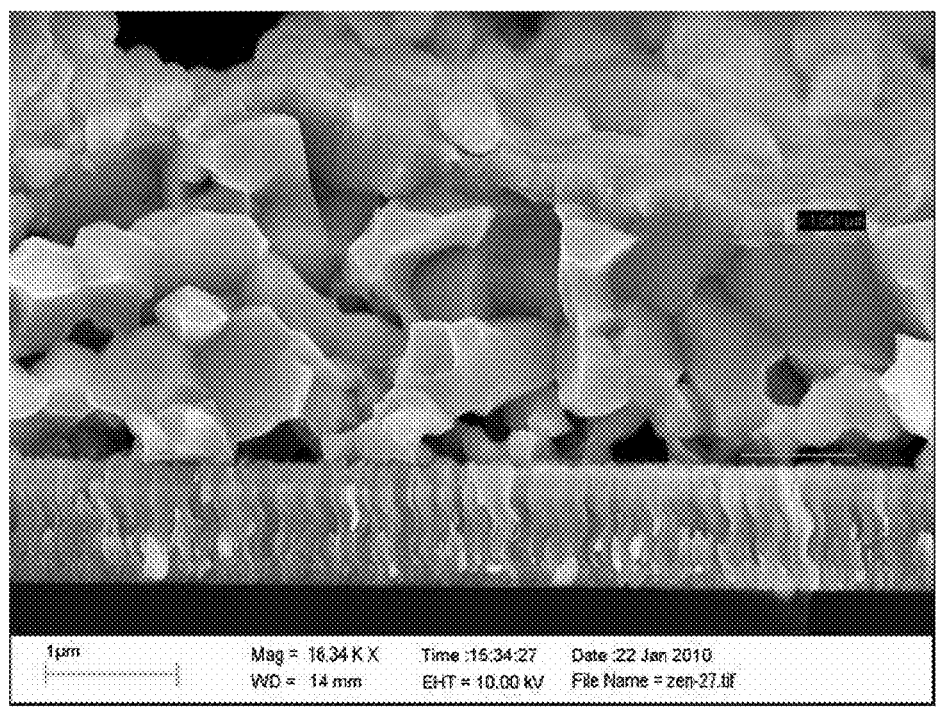
FIG. 3 is a cross-sectional scanning electron microscopy image of a solar cell prepared according to Example 3.

Referring to FIG. 3, a cross-sectional scanning electron microscopy image of a solar cell is shown. The film was prepared by a method according to Example 3.

Solar cells were fabricated from the above-described $Cu_2ZnSn(Se,S)_4$ films by deposition of 60 nm CdS buffer layer by chemical bath deposition, 100 nm insulating ZnO and 130 nm ITO (indium-doped zinc oxide) by sputtering (FIG. 1). In addition to the shown structure, Ni/Al metal contacts and 110 nm MgF coatings were deposited by electron-beam evaporation.

Total area photovoltaic device efficiency under simulated 1.5 AM illumination was 7.06%, with Voc=530 mV, Jsc=25 mA/cm$^2$ and FF=53%. On average, the efficiencies of 6-layer devices were only 1 absolute % lower than 5-layer reference devices spin coated from twice as concentrated pure hydrazine solution C1. Further optimization is expected to lead to similar device performance values between the two routes.

Example 2

Preparation of Aqueous Hydrazine-Hydrate Dispersions by Diluting Hydrazine Dispersion with Water.

Procedures were identical to Example 1 with the difference that, instead of ammonium hydroxide, 1 ml of water was mixed with 2 ml of the dispersion C1. Total area device photovoltaic efficiency under simulated 1.5 AM illumination was 6.35%, with Voc=452 mV, Jsc=27 mA/cm$^2$ and FF=51% (Device cross section shown in FIG. 2).

Example 3

Preparation of Inks without Using Pure Hydrazine as Intermediate Solvent

Procedures were identical to Example 1 with the difference that, instead of pure hydrazine being used as the initial solvent, ammonium hydroxide (aqueous ammonia 25%) solution was premixed with equal volume of hydrazine and further used as a principal solvent (Solvent S3). Half of the amount of each solid indicated in Example 1 was digested in respective dispersions A3 and B3 by the addition of 2.5 and 5 ml of solvent S3, respectively.

Total area device photovoltaic efficiency under simulated 1.5 AM illumination was 4.52%, with Voc=441 mV, Jsc=22 mA/cm$^2$ and FF=46%.

Layer uniformity observed by SEM (FIG. 3) requires further optimization which is expected to lead to significantly improved device parameters and result in efficiencies comparable to that of the pure hydrazine route.

The present invention has been described with particular reference to the preferred embodiments. It should be understood that variations and modifications thereof can be devised by those skilled in the art without departing from the spirit and scope of the present invention. Accordingly, the present invention embraces all such alternatives, modifications and variations that fall within the scope of the appended claims.

What is claimed is:

1. A method of depositing a kesterite film comprising a compound of the formula:

said method consisting of:

contacting a first amount of hydrazine, $Cu_2S$, and S to form a solution;

contacting a second amount of hydrazine, SnSe, Se, and Zn to form a dispersion including Zn-containing solid particles;

mixing the solution with the dispersion forming, in situ, an dispersion containing Zn-containing solid particles and dissolved components;

mixing the dispersion with an additional amount of ammonium hydroxide;

applying said dispersion with the additional amount of ammonium hydroxide onto a substrate to form a layer, wherein the dissolved components function as a binder; and annealing at a temperature, pressure, and length of time sufficient to form said kesterite film.

2. The method of claim 1, wherein the additional amount of the ammonium hydroxide provides a nominal ammonia content of about from 0.1 weight % to about 25 weight % of the dispersion.

3. The method of claim 1, wherein the zinc containing solid particles have a particle size from about 2 nm to about 2000 nm and ranges there between.

4. The method of claim 1, wherein the dissolved components contain at least one of S, Se, Cu and Sn.

5. The method of claim 1, wherein said substrate is selected from the group consisting of: metal foil, glass, ceramics, aluminum foil coated with a layer of molybdenum, a polymer, and a combination thereof.

6. The method of claim 1, wherein said substrate is coated with a transparent conductive coating.

7. The method of claim 1, wherein the step of applying is carried out by a method selected from the group consisting of: spin coating, dip coating, doctor blading, curtain coating, slide coating, spraying, slit casting, meniscus coating, screen printing, ink jet printing, pad printing, flexographic printing, and gravure printing.

8. The method of claim 1, wherein the step of annealing is carried out at a temperature from about 200° C. to about 800° C. and ranges there between.

9. The method of claim 8, wherein said annealing is carried out in an atmosphere which further comprises vapors of at least one of: sulfur, selenium, and a compound thereof.

10. The method of claim 1, wherein said annealing is carried out in an atmosphere comprising: at least one of: $N_2$, Ar, He, forming gas, and a mixture thereof.

* * * * *